US010529849B2

(12) United States Patent
Siddiqui et al.

(10) Patent No.: US 10,529,849 B2
(45) Date of Patent: Jan. 7, 2020

(54) HIGH-VOLTAGE SEMICONDUCTOR DEVICE INCLUDING A SUPER-JUNCTION DOPED STRUCTURE

(71) Applicant: Nuvoton Technology Corporation, Hsinchu Science Park (TW)

(72) Inventors: M D Imran Siddiqui, Jharkhand (IN); Po-An Chen, Toufen (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 15/858,792

(22) Filed: Dec. 29, 2017

(65) Prior Publication Data

US 2018/0190816 A1 Jul. 5, 2018

(30) Foreign Application Priority Data

Dec. 30, 2016 (TW) .............................. 105144152 A

(51) Int. Cl.
*H01L 29/78* (2006.01)
*H01L 29/08* (2006.01)
(Continued)

(52) U.S. Cl.
CPC ...... *H01L 29/7823* (2013.01); *H01L 21/2253* (2013.01); *H01L 21/266* (2013.01);
(Continued)

(58) Field of Classification Search
CPC .................... H01L 29/66681–66704; H01L 29/7816–7826; H01L 29/7835;
(Continued)

(56) References Cited

U.S. PATENT DOCUMENTS 5,426,325 A * 6/1995 Chang .................. H01L 21/266
257/335
8,592,901 B1 * 11/2013 Sheu ................. H01L 29/66681
257/335
(Continued)

FOREIGN PATENT DOCUMENTS

CN 101826554 A 9/2010
CN 103268886 B 6/2015
(Continued)

OTHER PUBLICATIONS

Qiao et al, Machine translation of IDS Foreign Patent Document CN103268886(B), Jun. 17, 2015.*
(Continued)

*Primary Examiner* — Younes Boulghassoul
(74) *Attorney, Agent, or Firm* — Muncy, Geissler, Olds & Lowe, P.C.

(57) ABSTRACT

A high-voltage semiconductor device is disclosed. The high-voltage semiconductor device includes a gate structure on a substrate structure. A drain doped region and a source doped region are located close to opposite sides of the gate structure. The source doped region, the gate structure and the drain doped region are located close to a top surface of the substrate structure. A super junction doped structure is located close to the drain doped region. The super junction doped structure includes a plurality of first conductive type doped sub-regions extending along a first direction and arranged along a second direction. A plurality of second conductive type doped sub-regions extends along the first direction and is arranged staggered with the first conductive type doped sub-regions. The widths of the first conductive type doped sub-regions and the second conductive type doped sub-regions along the second direction decrease linearly along the second direction.

16 Claims, 6 Drawing Sheets

(51) Int. Cl.

| | | |
|---|---|---|
| *H01L 29/06* | (2006.01) | |
| *H01L 29/66* | (2006.01) | |
| *H01L 29/36* | (2006.01) | |
| *H01L 29/10* | (2006.01) | |
| *H01L 27/088* | (2006.01) | |
| *H01L 29/423* | (2006.01) | |
| *H01L 21/266* | (2006.01) | |
| *H01L 21/8234* | (2006.01) | |
| *H01L 21/761* | (2006.01) | |
| *H01L 21/225* | (2006.01) | |
| *H01L 21/265* | (2006.01) | |
| *H01L 21/027* | (2006.01) | |

(52) U.S. Cl.
CPC .... *H01L 21/761* (2013.01); *H01L 21/823481* (2013.01); *H01L 27/088* (2013.01); *H01L 29/0634* (2013.01); *H01L 29/0653* (2013.01); *H01L 29/0847* (2013.01); *H01L 29/0865* (2013.01); *H01L 29/0878* (2013.01); *H01L 29/0882* (2013.01); *H01L 29/1087* (2013.01); *H01L 29/1095* (2013.01); *H01L 29/36* (2013.01); *H01L 29/66659* (2013.01); *H01L 29/66681* (2013.01); *H01L 29/66689* (2013.01); *H01L 29/7816* (2013.01); *H01L 29/7835* (2013.01); *H01L 21/0274* (2013.01); *H01L 21/26513* (2013.01); *H01L 29/1083* (2013.01); *H01L 29/42368* (2013.01)

(58) Field of Classification Search
CPC .......... H01L 29/66659; H01L 29/1095; H01L 29/0646; H01L 29/0615–0634; H01L 29/0688; H01L 29/7823; H01L 21/761; H01L 29/0603–0696; H01L 29/36
See application file for complete search history.

(56) References Cited

U.S. PATENT DOCUMENTS

| 9,082,841 | B1 | 7/2015 | Chang et al. | |
|---|---|---|---|---|
| 2003/0193067 | A1* | 10/2003 | Kim | H01L 29/0634 257/343 |
| 2004/0217377 | A1* | 11/2004 | Deboy | H01L 29/0634 257/197 |
| 2004/0222461 | A1* | 11/2004 | Peyre-Lavigne | H01L 29/0619 257/333 |
| 2007/0272979 | A1* | 11/2007 | Saito | H01L 29/0634 257/335 |
| 2011/0233714 | A1* | 9/2011 | Lu | H01L 29/66348 257/493 |
| 2012/0086052 | A1* | 4/2012 | Chen | H01L 29/0607 257/288 |
| 2012/0126323 | A1* | 5/2012 | Wu | H01L 29/0634 257/343 |
| 2012/0241861 | A1* | 9/2012 | Chen | H01L 29/0634 257/339 |
| 2013/0020680 | A1 | 1/2013 | Chen et al. | |
| 2013/0214355 | A1* | 8/2013 | Fang | H01L 29/0634 257/343 |
| 2013/0341718 | A1 | 12/2013 | Kim et al. | |
| 2014/0027811 | A1* | 1/2014 | Chen | H01L 29/7436 257/137 |
| 2014/0048880 | A1 | 2/2014 | Tsuchiko | |
| 2014/0061788 | A1* | 3/2014 | Chen | H01L 29/7816 257/339 |
| 2014/0353678 | A1* | 12/2014 | Kawakami | H01L 21/266 257/76 |
| 2015/0048449 | A1 | 2/2015 | Jeon et al. | |
| 2015/0221721 | A1* | 8/2015 | Kawakami | H01L 29/6606 257/76 |
| 2016/0172436 | A1 | 6/2016 | Ho et al. | |
| 2016/0254375 | A1 | 9/2016 | Nakamura | |
| 2017/0200784 | A1* | 7/2017 | Shirakawa | H01L 21/2252 |
| 2017/0365595 | A1 | 12/2017 | He et al. | |
| 2018/0033854 | A1 | 2/2018 | Kaya et al. | |

FOREIGN PATENT DOCUMENTS

| CN | 106206425 A | 12/2016 |
|---|---|---|
| TW | 201225292 A | 6/2012 |
| TW | I467766 B | 1/2015 |
| TW | I527098 B | 3/2016 |

OTHER PUBLICATIONS

Lei et al., Machine translation of IDS Foreign Patent Document CN101826554(A), Sep. 8, 2010.*
Taiwan Office Action dated Apr. 25, 2018 issued in corresponding application TW 106146498, with search report, 9 pages.
U.S. Office Action in U.S. Appl. No. 15/859,042 dated Jul. 19, 2018; pp. 1-22.
U.S. Office Action of related U.S. Appl. No. 15/859,042 dated Jun. 12, 2019, 11 pages.

* cited by examiner

HIGH-VOLTAGE SEMICONDUCTOR DEVICE INCLUDING A SUPER-JUNCTION DOPED STRUCTURE

CROSS REFERENCE TO RELATED APPLICATIONS

This Application claims priority of Taiwan Patent Application No. 105144152, filed on Dec. 30, 2016, the entirety of which is incorporated by reference herein.

BACKGROUND OF THE INVENTION

Field of the Invention

The present invention relates to a semiconductor device, and in particular to a high-voltage semiconductor device.

Description of the Related Art

High-voltage integrated circuit (HVIC) devices have been widely applied in the fields of light emitting diodes (LEDs), display driver integrated circuit devices, power supplies, power management integrated circuit (PMIC) devices, communication devices and power control systems of mobile electronics due to its advantages of cost-effectiveness and easy integration with other processes. However, it is hard to improved upon the conventional high-voltage integrated circuit due to disadvantages that include the latch-up effect, low punch-through voltage, low switching speed, and large device area.

Thus, a high-voltage semiconductor device is needed in order to overcome these technical challenges.

BRIEF SUMMARY OF THE INVENTION

Exemplary embodiments of a high-voltage semiconductor device are provided. The high-voltage semiconductor device includes a substrate structure. A gate structure is disposed on the substrate structure. A drain doped region is located in the substrate structure and close to a first side of the gate structure. A source doped region is located in the substrate structure and close to a second side of the gate structure. The second side is opposite to the first side. The source doped region, the gate structure and the drain doped region are located on a top surface of the substrate structure. A super junction doped structure is located in the substrate structure and close to the drain doped region. The super junction doped structure includes a plurality of first conductive type doped sub-regions having a first conductivity type. The plurality of first conductive type doped sub-regions extends along a first direction and is arranged along a second direction. A plurality of second conductive type doped sub-regions has a second conductivity type that is different from the first conductivity type. The plurality of second conductive type doped sub-regions extends along the first direction and is staggered with the plurality of first conductive type doped sub-regions along the second direction. The widths of the plurality of first conductive type doped sub-regions along the second direction decrease linearly along the second direction. The widths of the plurality of second conductive type doped sub-regions along the second direction decrease linearly along the second direction.

Another exemplary embodiment of a high-voltage semiconductor device includes a substrate structure. A gate structure is disposed on the substrate structure. A drain doped region is located in the substrate structure and close to a first side of the gate structure. A source doped region is located in the substrate structure and close to a second side of the gate structure. The second side is opposite to the first side. The source doped region, the gate structure and the drain doped region are located on a top surface of the substrate structure. A super junction doped structure is located in the substrate structure and close to the drain doped region. The super junction doped structure includes a plurality of first conductive type doped sub-regions having a first conductivity type. The plurality of first conductive type doped sub-regions extends along a first direction and is arranged along a second direction. A plurality of second conductive type doped sub-regions has a second conductivity type that is different from the first conductivity type. The plurality of second conductive type doped sub-regions extends along the first direction and is staggered with the plurality of first conductive type doped sub-regions along the second direction. At least one of the depths of the plurality of first conductive type doped sub-regions along the first direction, the widths of the plurality of first conductive type doped sub-regions along second direction and dopant concentrations of the plurality of first conductive type doped sub-regions decreases linearly along the second direction.

An exemplary embodiment of a high-voltage semiconductor device includes a substrate structure. A gate structure is disposed on the substrate structure. A drain doped region is located in the substrate structure and close to a first side of the gate structure. A source doped region is located in the substrate structure and close to a second side of the gate structure. The second side is opposite to the first side. The source doped region, the gate structure and the drain doped region are located on a top surface of the substrate structure. A super junction doped structure is located in the substrate structure and close to the drain doped region. The super junction doped structure includes a first conductive type doped sub-region and a second conductive type doped sub-region adjacent to each other. The first conductive type doped sub-region has a first conductively and the second conductive type doped sub-region has a second conductivity type that is different from the first conductivity type. The first conductive type doped sub-region and the second conductive type doped sub-region extend along a first direction and are arranged along a second direction. At least one of the depth of the first conductive type doped sub-region along the first direction, the width of first conductive type doped sub-region along second direction and the dopant concentration of the first conductive type doped sub-region is different from the second conductive type doped sub-region along the second direction.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments provide a high-voltage semiconductor device used as an ultra high-voltage laterally diffused metal oxide semiconductor (UHV LDMOS) device or a high-voltage integrated circuit (HVIC) device. The high-voltage semiconductor device includes a super junction doped structure. At least one of the width, the depth and the dopant concentration of the super junction doped structure decreases linearly along a direction to construct a reduced surface field (RESURF) structure. Therefore, the super junction doped structure may effectively reduce the surface field of the high-voltage semiconductor device. In addition, the high-voltage semiconductor device may achieve a high breakdown voltage (BVD).

Figure 1:
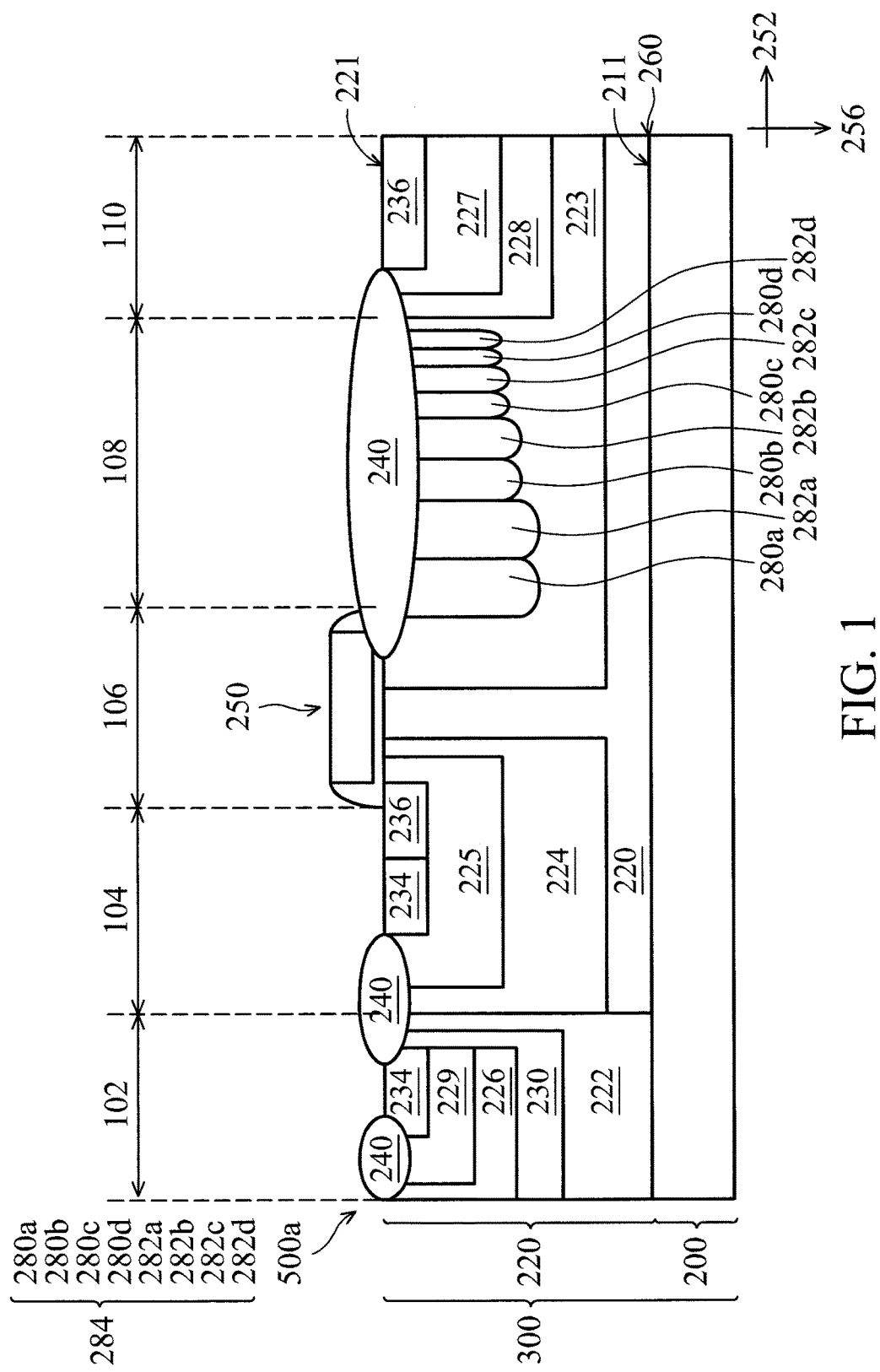
FIG. 1 is a schematic cross-sectional view showing a high-voltage semiconductor device in accordance with some embodiments of the disclosure.

FIG. 1 is a schematic cross-sectional view showing a high-voltage semiconductor device 500a in accordance with some embodiments of the disclosure. In this embodiment, high-voltage semiconductor device 500a may be an ultra high-voltage laterally diffused metal oxide semiconductor (UHV LDMOS) device. The high-voltage semiconductor device 500a may include a substrate structure 300, a gate structure 250, a source doped region, a super junction doped structure 284, a drain doped region and a pick-up doped region.

As shown in FIG. 1, the substrate structure 300 includes a semiconductor substrate 200 and an epitaxial layer 220 entirely formed on a top surface 211 of the semiconductor substrate 200. The semiconductor substrate 200 has a first conductive type by doping dopants. For example, when the first conductive type is P-type, and the semiconductor substrate 200 may serve as a P-type substrate. In some embodiments, the dopant concentration of the semiconductor substrate 200 is about $1 \times 10^{11}$-$1 \times 10^{15}$/cm$^3$, so that the semiconductor substrate 200 may serve as a lightly doped P-type substrate. The term "lightly doped" indicates that the dopant concentration is less than about $1 \times 10^{15}$/cm$^3$. In some embodiments, the semiconductor substrate 200 may comprise a silicon substrate. In some other embodiments, a SiGe substrate, a bulk semiconductor substrate, a strained semiconductor substrate, a compound semiconductor substrate or another commonly used semiconductor substrate can be used as the semiconductor substrate 200. The epitaxial layer 220 may be formed of silicon, germanium, silicon and germanium, III-V compound semiconductors or combinations thereof. The epitaxial layer 220 may have a second conductive type that is different from the first conductive type. For example, when the first conductive type is P-type, the second conductive type is N-type. Also, the epitaxial layer 220 may serve as an N-type epitaxial layer 220. In some embodiments, the epitaxial layer 220 may have a dopant such as phosphorus (P).

As shown in FIG. 1, the substrate structure 300 includes a pick-up region 102, a source region 104, a gate region 106, a drift region 108 and a drain region 110, which are arranged in sequence from left to right in a direction (e.g. a second direction 252) parallel to the top surface 221 of the epitaxial layer 220.

As shown in FIG. 1, the high-voltage semiconductor device 500a includes a plurality of isolation structures 240 disposed on the top surface 221 of the epitaxial layer 220 to define active regions in the pick-up region 102, the source region 104, the gate region 106 and the drain region 110. In addition, at least one of the isolation structures 240 covers the drift region 108. For example, the isolation structures 240 define locations for forming the gate structure 250, the source doped region, the drain doped region and the pick-up doped region. In some embodiments, the isolation structures 240 may include local oxidation of silicon (LOCOS) features or shallow trench isolation (STI) features.

As shown in FIG. 1, the high-voltage semiconductor device 500a includes a high-voltage first conductivity type well region 222, a high-voltage second conductivity type well region 224 and a second conductivity type deep well region 223 disposed in the epitaxial layer 220. The high-voltage first conductivity type well region 222 is located in the pick-up region 102, the high-voltage second conductivity type well region 224 is located in the source region 104, and the second conductivity type deep well region 223 is located in the rift region 108 and the drain region 110. For example, when the first conductive type is P-type, the second conductive type is N-type. The high-voltage first conductivity type well region 222 may serve as a high-voltage P-type well region (HVPW) 222, the high-voltage second conductivity type well region 224 may serve as a high-voltage N-type well region (HVNW) 224, and the second conductivity type deep well region 223 may serve as an N-type deep well region (DNW) 223. In some embodiments, a bottom surface of the high-voltage second conductivity type well region 224 and a bottom surface of the second conductivity type deep well region 223 may be located in the epitaxial layer 220. In addition, a bottom surface of the high-voltage first conductivity type well region 222 may be aligned with an interface 260 between the substrate 200 and the epitaxial layer 220 (the position is the same as the position of the top surface 211 of the substrate 200). The high-voltage first conductivity type well region 222, the high-voltage second conductivity type well region 224 and the second conductivity type deep well region 223 may be formed by the implantation process.

In some embodiments, the pick-up region 102 of the high-voltage semiconductor device 500a includes a first conductivity type drift doped region 230, a first conductivity type well region 226, a first conductivity type field doped region 229 and a first conductivity type pick-up doped region 234, which are arranged sequentially from bottom to top, disposed on the high-voltage first conductivity type well region 222. For example, when the first conductive type is P-type, the first conductivity type drift doped region 230 may serve as a P-type drift (P-drift) doped region 230, the first conductivity type well region 226 may serve as a P-type well (PW) region 226, the first conductivity type field doped region 229 may serve as a P-type field (P-field) doped region 229, and the first conductivity type pick-up doped region 234 may serve as a P-type pick-up doped region 234.

In some embodiments, the dopant concentration of the first conductivity type pick-up doped region 234 is greater than the dopant concentration of the first conductivity type field doped region 229. The dopant concentration of the first conductivity type field doped region 229 is greater than the dopant concentration of the first conductivity type well region 226. The dopant concentration of the first conductivity type well region 226 is greater than the dopant concentration of the P-type drift doped region 230. Also, the dopant concentration of the P-type drift doped region 230 is greater than the dopant concentration of the high-voltage first conductivity type well region 222. The first conductivity type drift doped region 230, the first conductivity type well region 226, the first conductivity type field doped region 229 and the first conductivity type pick-up doped region 234 may be formed using different implantation processes.

As shown in FIG. 1, the source region 104 of the high-voltage semiconductor device 500a may include a first conductivity type well region 225, a first conductivity type pick-up doped region 234 and a second conductivity type pick-up doped region 236, which are arranged sequentially from bottom to top, disposed on the high-voltage second conductivity type well region 224. For example, when the first conductive type is P-type, the second conductive type is N-type, the first conductivity type well region 225 may serve as an isolated P-type well (IPW) region 225, the first conductivity type pick-up doped region 234 may serve as a P-type pick-up doped region 234, and the second conductivity type pick-up doped region 236 may serve as an N-type pick-up doped region 236. In addition, the first conductivity type well region 225, the first conductivity type pick-up doped region 234 and the second conductivity type pick-up doped region 236 in the source region 104 may collectively construct a source doped region.

In some embodiments, the dopant concentration of the first conductivity type pick-up doped region 234 is greater than the dopant concentration of the first conductivity type well region 225. The dopant concentration of the second conductivity type pick-up doped region 236 is greater than the dopant concentration of the high-voltage second conductivity type well region 224. The first conductivity type well region 225, the first conductivity type pick-up doped region 234 and the second conductivity type pick-up doped region 236 may be formed using different implantation processes.

As shown in FIG. 1, the drain region 110 of the high-voltage semiconductor device 500a may include a second conductivity type drift doped region 228, a second conductivity type buffer doped region 227 and a second conductivity type pick-up doped region 236, which are arranged sequentially from bottom to top, disposed on the second conductivity type deep well region 223. For example, when the first conductive type is P-type, the second conductive type is N-type, the second conductivity type drift doped region 228 may serve as an N-type drift (N-drift) doped region 228, the second conductivity type buffer doped region 227 may serve as an N-type buffer (N-buffer) doped region 227, and the second conductivity type pick-up doped region 236 may serve as an N-type pick-up doped region 236. In addition, the second conductivity type drift doped region 228, the second conductivity type buffer doped region 227 and the second conductivity type pick-up doped region 236 in the drain region 110 may collectively construct a drain doped region.

In some embodiments, the dopant concentration of the second conductivity type pick-up doped region 236 is greater than the dopant concentration of the second conductivity type buffer doped region 227. Also, the dopant concentration of the second conductivity type buffer doped region 227 is greater than the dopant concentration of the second conductivity type drift doped region 228. The second conductivity type drift doped region 228, the second conductivity type buffer doped region 227 and the second conductivity type pick-up doped region 236 may be formed using different implantation processes.

As shown in FIG. 1, the gate structure 250 of the high-voltage semiconductor device 500 is disposed on the top surface 221 of the epitaxial layer 220 and located in the gate region 106. The source doped region and the drain doped region of the high-voltage semiconductor device 500a are respectively located on opposite sides of the gate structure 250. A first side of the gate structure 250, which is close to the source region 104, covers the high-voltage second conductivity type well region 224. Also, a second side of the gate structure 250, which is close to the drift region 108, covers a portion of the isolation structure 240 in the drift region 108 and a portion of the second conductivity type deep well region 223 under the isolation structure 240. The gate structure 250 is separated from the drain doped region through the isolation structure 240 in the drift region 108. The gate structure 250 includes a gate insulating material (not shown) and a gate conductive material located on the gate insulating material. The gate structure 250 may be formed using a thin film deposition process, such as chemical vapor deposition (CVD) or atomic layer deposition (ALD), and a subsequent patterning process.

Next, the position of the super junction doped structure 284 of the high-voltage semiconductor device 500a is described using FIG. 1. The super junction doped structure 284 is located in the second conductivity type deep well region 223 under the isolation structure 240 within the drift region 108. Also, the super junction doped structure 284 is separated from the drain doped region by a distance. In addition, the super junction doped structure 284 is located between the gate structure 250 and the drain doped region. In some embodiments, the super junction doped structure 284 includes a plurality of first conductive type doped sub-regions 280a, 280b, 280c and 280d, and a plurality of second conductive type doped sub-regions 282a, 282b, 282c and 282d. The first conductive type doped sub-regions 280a, 280b, 280c and 280d have a first conductivity type. The first conductive type doped sub-regions 280a, 280b, 280c and 280d extend along a first direction 256 and are arranged along a second direction 252. In addition, the second conductive type doped sub-regions 282a, 282b, 282c and 282d have a second conductivity type. The second conductive type doped sub-regions 282a, 282b, 282c and 282d extend along the first direction 256. Also, the second conductive type doped sub-regions 282a, 282b, 282c and 282d are arranged staggered with the first conductive type doped sub-regions 280a, 280b, 280c and 280d along the second direction 252.

In a cross-sectional view shown in FIG. 1, the first conductive type doped sub-regions 280a, 280b, 280c and 280d and the second conductive type doped sub-regions 282a, 282b, 282c and 282d are strip (pillar) shapes extending along the first direction 256. It should be noted that the first direction 256 is substantially parallel to a direction along the normal line of the top surface 221 of the substrate structure 300. Also, the second direction 252 is substantially parallel to a direction from the gate structure 250 to the drain doped region.

As shown in FIG. 1, opposite sides of the second conductive type doped sub-region 282a are respectively adjacent to the first conductive type doped sub-regions 280a and 280b. Opposite sides of the first conductive type doped sub-region 280b are respectively adjacent to the second conductive type doped sub-regions 282a and 282b. The adjacency between the remaining first conductive type doped sub-regions and the remaining second conductive type doped sub-regions may be similar to adjacency between the first conductive type doped sub-regions 280a and 280b and the second conductive type doped sub-regions 282a and 282b. However, in other embodiments, the positions of the first conductive type doped sub-regions 280a, 280b, 280c and 280d and the positions of the second conductive type doped sub-regions 282a, 282b, 282c and 282d can be exchanged.

For example, when the first conductive type is P-type, the second conductive type is N-type. The first conductive type doped sub-regions 280a, 280b, 280c and 280d are respectively P-type doped sub-regions 280a, 280b, 280c and 280d, and the second conductive type doped sub-regions 282a, 282b, 282c and 282d are respectively N-type doped sub-regions 282a, 282b, 282c and 282d. Therefore, the first conductive type doped sub-region and the second conductive type doped sub-region adjacent thereto may form a PN junction. For example, the first conductive type doped sub-regions 280a and the adjacent second conductive type doped sub-regions 282a may form a PN junction. The first conductive type doped sub-regions 280b may respectively form two PN junction with the two neighboring second conductive type doped sub-regions 282a and 282b. The positions of the remaining PN junctions of the super junction doped structure 284 may be obtained by the adjacency between the remaining first conductive type doped sub-regions and the remaining second conductive type doped sub-regions.

In some embodiments, in the super junction doped structure 284, at least one of the depths of the first conductive type doped sub-regions 280a, 280b, 280c and 280d along the first direction 256, the widths of the first conductive type doped sub-regions 280a, 280b, 280c and 280d along the second direction 252 the dopant concentrations of the first conductive type doped sub-regions 280a, 280b, 280c and 280d decrease linearly along the second direction 252. Similarly, at least one of the depths of the second conductive type doped sub-regions 282a, 282b, 282c and 282d along the first direction 256, the widths of the second conductive type doped sub-regions 282a, 282b, 282c and 282d along the second direction 252 and the dopant concentration of the second conductive type doped sub-regions 282a, 282b, 282c and 282d decrease linearly along the second direction 252. In some embodiments shown in FIG. 1, the width Wa of the first conductive type doped sub-region 280a, the width Wb of the first conductive type doped sub-region 280b, the width Wc of the first conductive type doped sub-region 280c and the width of Wd of the first conductive type doped sub-region 280d decrease linearly along the second direction 252. Also, the width Wa of the second conductive type doped sub-region 282a, the width Wb of the second conductive type doped sub-region 282b, the width Wc of the second conductive type doped sub-region 282c and the width of Wd of the second conductive type doped sub-region 282d decrease linearly along the second direction 252.

Figure 2A:
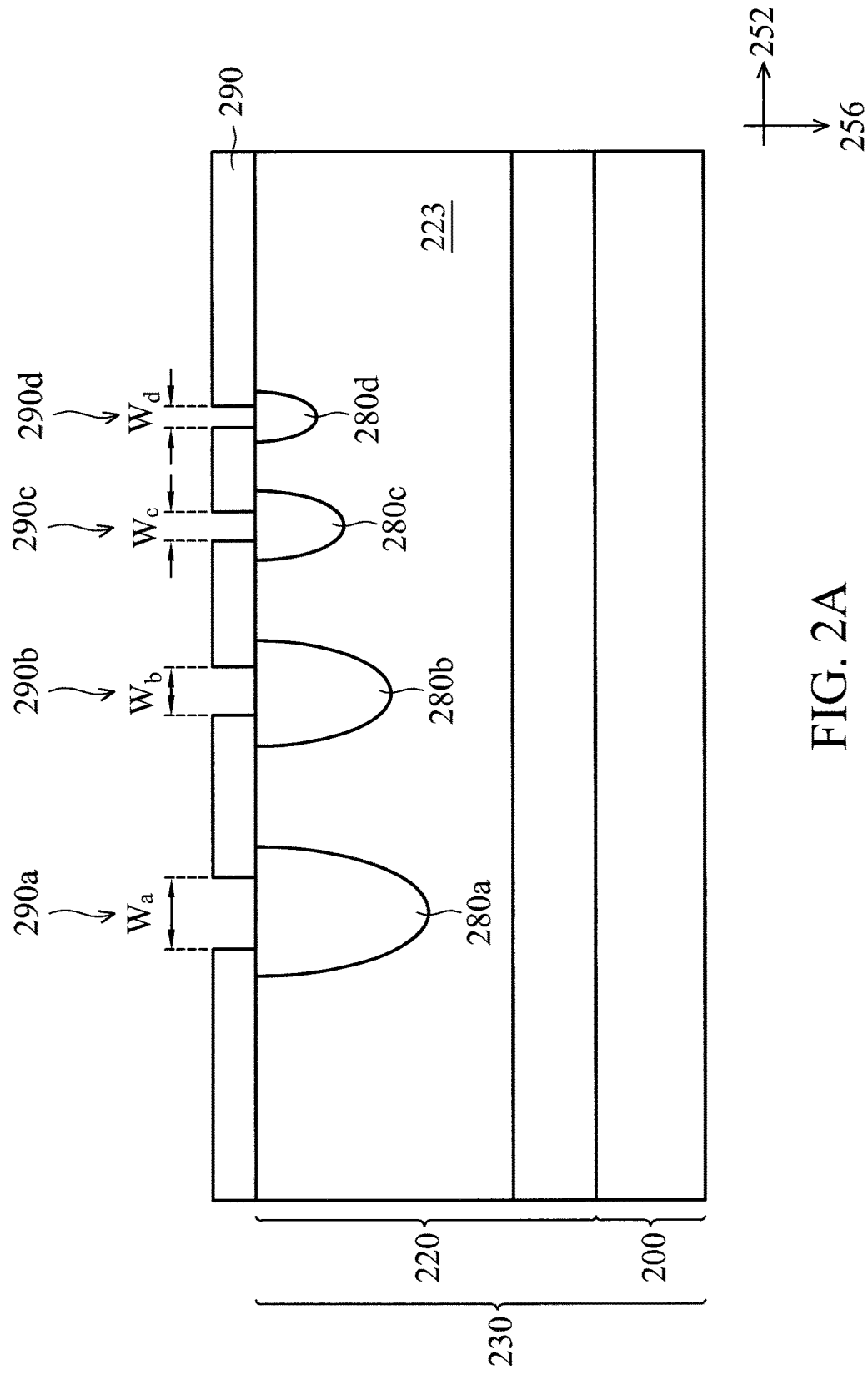
FIGS. 2A and 2B are schematic cross-sectional views showing intermediate stages of a method for fabricating a super junction doped structure in a drift region in accordance with some embodiments of the disclosure.
Figure 2B:
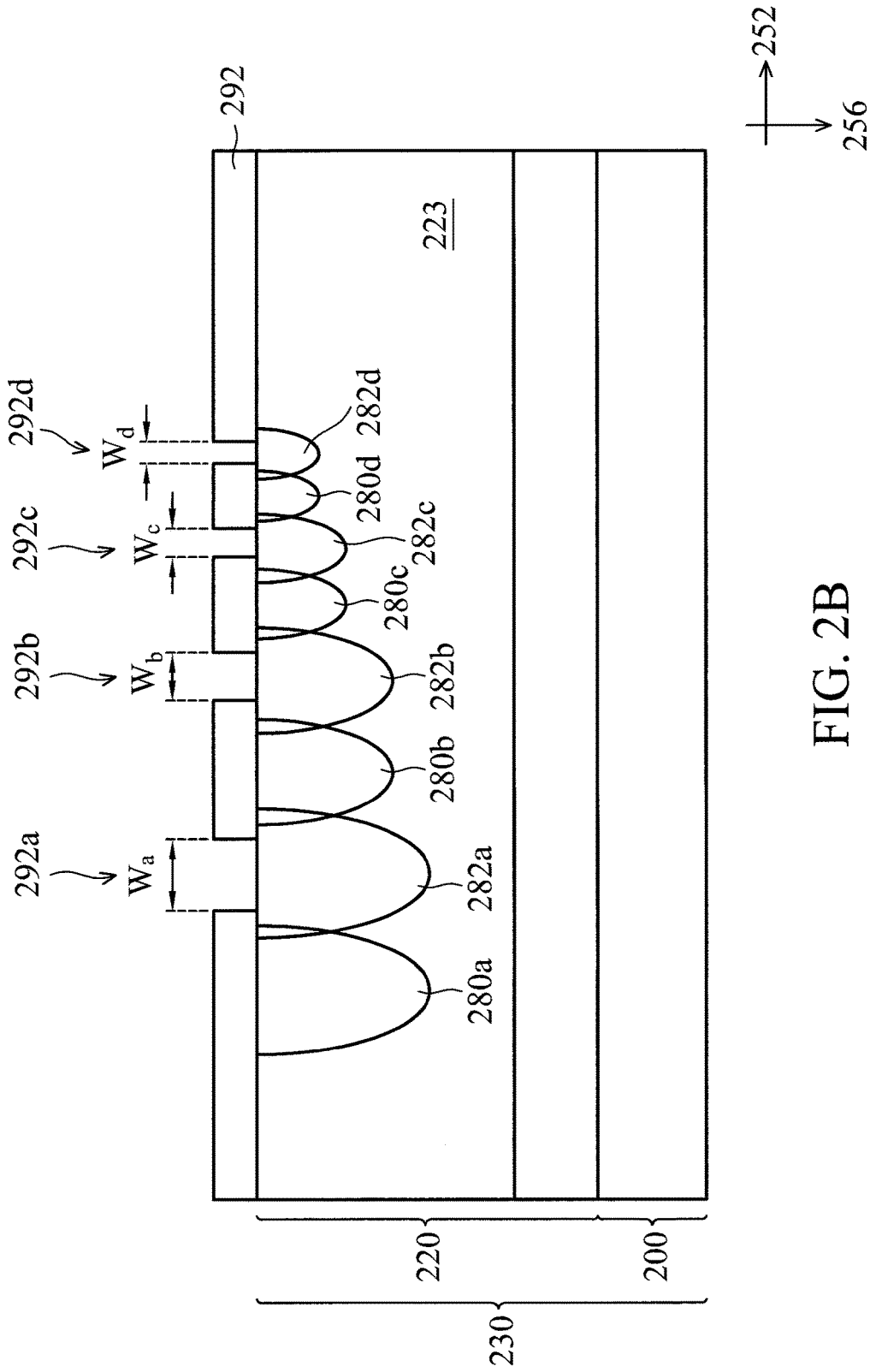

Next, the method for fabricating the super junction doped structure 284 shown in FIG. 1 in accordance with some embodiments of the disclosure is described using FIGS. 2A and 2B. FIGS. 2A and 2B are enlarged views of the drift region 108 of the semiconductor device shown in FIG. 1. Also, FIGS. 2A and 2B illustrate intermediate stages of a method for fabricating the super junction doped structure 284 in the drift region 108. The method is performed before forming the isolation structures 240 shown in FIG. 1. Therefore, the isolation structures 240 are not shown in FIGS. 2A and 2B.

As shown in FIG. 2A, a photolithography process may be performed to form a mask pattern 290 on the top surface 221 of the epitaxial layer 220 in the drift region 108 (shown in FIG. 1). The mask pattern 290 may have a plurality of openings 290a, 290b, 290c and 290d. Portions of the second conductivity type deep well region 223 in the drift region 108 are exposed to the openings 290a, 290b, 290c and 290d of the mask pattern 290. In some embodiments, as shown in FIG. 2A, four openings (the openings 290a-290d) are shown for clarity, but the number of openings of the mask pattern 290 is not limited to the disclosed embodiments. In other embodiments, the number of openings of the mask pattern 290 is set to meet requirements. In some embodiments, as shown in FIG. 2A, the openings 290a of the mask pattern 290 are disposed to be close to the gate structure 250. In addition, the openings 290a, 290b, 290c and 290d of the mask pattern 290 are sequentially arranged from the gate structure 250 to the drain doped region (constructed by the second conductivity type drift doped region 228, the second conductivity type buffer doped region 227 and the second conductivity type pick-up doped region 236 shown in FIG. 1). In this embodiment, the width Wa of the opening 290a, the width Wb of the of the opening 290b, the width We of the of the opening 290c and the width Wb of the of the opening 290d of the mask pattern 290 are designed to be decreased linearly and sequentially from the gate structure 250 to the drain doped region. In any two neighboring openings of the openings 290a-290d of the mask pattern 290, the width of the one close to the gate structure 250 is greater than that of the other one that is farther away from the gate structure 250. For example, to the two neighboring openings 290a and 290b of the mask pattern 290, the width Wa of the opening 290a, which is close to gate structure 250 is greater than the width Wb of the opening 290b, which is away from the gate structure 250. The relationship of the widths between the other two neighboring openings of the mask pattern 290 may be similar to the widths of the openings 290a and 290b.

Next, please refer to FIG. 2A, an implantation process is performed using the mask pattern 290 as a mask to implant a dopant having the first conductivity type. Therefore, a plurality of first conductive type doped sub-regions 280a, 280b, 280c and 280d are formed in portions of the second conductivity type deep well region 223 exposed to the openings 290a-290d. Because the widths Wa, Wb, We and Wd of the openings 290a-290d of the mask pattern 290 decrease linearly along the second direction 252 (from the gate structure 250 to the drain doped region), the depths and/or the dopant concentrations of the first conductive type doped sub-regions 280a-280d decrease linearly along the second direction 252. In any two neighboring first conductive type doped sub-regions of the first conductive type doped sub-regions 280a-280d, the depths and/or the dopant concentrations of the one close to the central region of the gate structure 250 may be greater than the depths and/or the dopant concentrations of the other one that is farther away from the gate structure 250. For example, to the two neighboring first conductive type doped sub-regions 280a and 280b, the depth and/or the dopant concentration of the first conductive type doped sub-regions 280a close to gate structure 250 is greater than the depth and/or the dopant concentration of the first conductive type doped sub-regions 280b away from the gate structure 250. The relationship of the depths between the remaining two neighboring first conductive type doped sub-regions may be similar to the first conductive type doped sub-regions 280a and 280b. Next, the mask pattern 290 is removed.

In some embodiments, the first conductive type doped sub-regions 280a-280d and the first conductivity type drift doped region 230 may be formed simultaneously.

Next, please refer to FIG. 2B: another photolithography process may be performed to form a mask pattern 292 on the top surface 221 of the epitaxial layer 220 in the drift region 108 (shown in FIG. 1). The mask pattern 292 may have a plurality of openings 292a, 292b, 292c and 292d. Portions of the second conductivity type deep well region 223 in the drift region 108 are exposed to the openings 292a, 292b, 292c and 292d. In some embodiments, as shown in FIG. 2B, four openings (the openings 292a-292d) of the mask pattern 292 are shown for clarity, but the number of openings of the mask pattern 292 is not limited to the disclosed embodiments. In other embodiments, the number of openings of the mask pattern 292 is set to meet requirements. In some embodiments, as shown in FIG. 2B, the relationship between the widths Wa, Wb, Wc and Wd of the openings 292a, 292b, 292c and 292d may be similar to that between the widths Wa, Wb, Wc and Wd of the openings 290a-290d and is not repeated herein.

In other embodiments, the widths of the openings of mask pattern 292 may be designed to have different values and only to ensure that the widths of the openings of mask pattern 292 decrease linearly from the gate structure 250 to the drain doped region.

Next, please refer to FIG. 2B, an implantation process is performed using the mask pattern 292 as a mask to implant a dopant having the second conductivity type. Therefore, a plurality of second conductive type doped sub-regions 282a, 282b, 282c and 282d are formed in portions of the second conductivity type deep well region 223 exposed to the openings 292a-292d. The second conductive type doped sub-regions 282a, 282b, 282c and 282d are respectively adjacent to the first conductive type doped sub-regions 280a, 280b, 280c and 280d. The relationship of depths and/or the dopant concentrations between the second conductive type doped sub-regions 282a-282d is similar to the relationship of depths and/or the dopant concentrations between the first conductive type doped sub-regions 280a-280d and is not repeated herein. Next, the mask pattern 292 is removed.

In some embodiments, the second conductive type doped sub-regions 282a-282d and the second conductivity type drift doped region 228 may be formed simultaneously.

Next, an annealing process is performed to cause the uniform diffusion of the dopants in the first conductive type doped sub-regions 280a-280d and the second conductive type doped sub-regions 282a-282d shown in FIG. 2B. Therefore, the diffused first conductive type doped sub-regions 280a-280d and the diffused second conductive type doped sub-regions 282a-282d form the super junction doped structure 284 having a plurality of PN junctions shown in FIG. 1.

In some embodiments, the super junction doped structure 284 is arranged between the gate structure 250 and the drain doped region of the high-voltage semiconductor device 500a, such as an UHV LDMOS device. The super junction doped structure 284 may serve as a drift doped region. At least one of the widths, the depths and the dopant concentrations of the first conductive type doped sub-regions 280a-280d and the second conductive type doped sub-regions 282a-282d of the super junction doped structure 284 decrease linearly along a direction from the gate structure 250 to the drain doped region (the second direction 252).

The design of the super junction doped structure 284 (the drift doped region) may help fully deplete the drift doped region to achieve the goal of the charge balance characteristic and to construct a reduced surface field (RESURF) structure to reduce the surface field of the UHV LDMOS device. In addition, the super junction doped structure may have a high breakdown voltage (BVD) value and a low on resistance (Ron) value while a length of the drift doped region is fixed.

Figure 3:
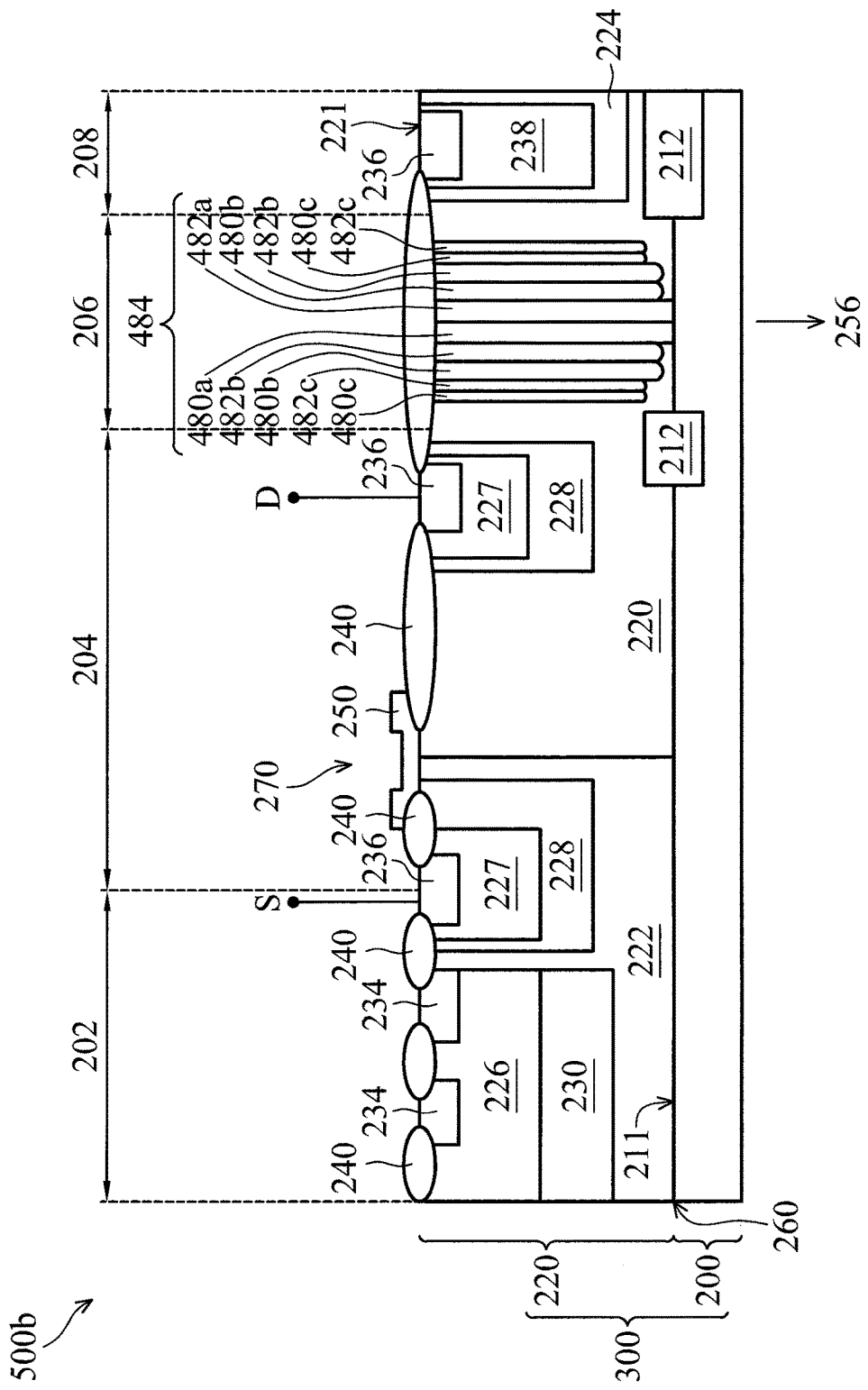
FIG. 3 is a schematic cross-sectional view showing a high-voltage semiconductor device in accordance with some embodiments of the disclosure.

FIG. 3 is a schematic cross-sectional view showing a high-voltage semiconductor device 500b in accordance with some embodiments of the disclosure. In this embodiment, the high-voltage semiconductor device 500b is a high-voltage integrated circuit (HVIC) device. The high-voltage semiconductor device 500b may include a substrate structure 300, a lateral diffused metal-oxide-semiconductor (LDMOS) 270, a super junction doped structure 484 and a pick-up doped region. Elements of the embodiments hereinafter that are the same or similar as those previously described with reference to FIG. 1, are not repeated for brevity.

As shown in FIG. 3, the substrate structure 300 includes a semiconductor substrate 200 and an epitaxial layer 220 entirely formed on a top surface 211 of the semiconductor substrate 200. In addition, the substrate structure 300 includes a low side region 202, a high side region 208 and a level-shift region 204 disposed between the low side region 202 and the high side region 208. The low side region 202, the high side region 208 and the level-shift region 204 are arranged in sequence from left to right along a direction (such as the second direction 252) substantially parallel to the top surface 221 of the epitaxial layer 220. The isolation region 206 is located between the level-shift region 204 and the high side region 208, so that the level-shift region 204 and the high side region 208 are separated from each other through the isolation region 206.

As shown in FIG. 3, the high-voltage semiconductor device 500b includes a plurality of isolation structures 240 disposed on the top surface 221 of the epitaxial layer 220. The isolation structures 240 cover portions of the top surface 221 of the epitaxial layer 220 in the low side region 202, the level-shift region 204, the isolation region 206 and the high side region 208. The isolation structures 240 define active regions in the low side region 202, the level-shift region 204, the isolation region 206 and the high side region 208. For example, the isolation structures 240 define the position of a pick-up doped region in the low side region 202, positions of a gate, a source doped region and a drain doped region of the LDMOS device in the level-shift region 204, and the position of a pick-up doped region in the high side region 208.

In some embodiments, the low side region 202 is provided for a low-voltage integrated circuit device (the operation voltage of which can be, for example, lower than about 20V) formed thereon. The high side region 208 is provided for a high-voltage integrated circuit device (the operation voltage of which can be, for example, larger than or equal to about 600V) formed thereon. In addition, the level-shift region 204 may include a lateral diffused metal-oxide-semiconductor (LDMOS) device 270 formed thereon. The low side region 202 and the high side region 208 of the LDMOS are electrically isolated from each other by the isolation region 206 while the LDMOS device is in the off-state.

The source S of the LDMOS device 270 in the level-shift region 204 may be electrically coupled to the low-voltage integrated circuit device in the low side region 202. In addition, the drain D of the LDMOS device 270 in the level-shift region 204 may be electrically coupled to the high-voltage integrated circuit device in the high side region 208 through metal interconnections (not shown) crossing the isolation region 206. When the LDMOS device is in the on-state, the LDMOS device 270 can transfer a low voltage value suitable for the low side region 202 to a high voltage value suitable for the high side region 208.

As shown in FIG. 3, the high-voltage semiconductor device 500a includes a high-voltage first conductivity type well region 222 disposed in the epitaxial layer 220 in the low side region 202 and the level-shift region 204. A boundary of the high-voltage first conductivity type well region 222 can be located directly below a gate structure 250 of the LDMOS device 270. The high-voltage first conductivity type well region 222 can provide the source doped region of the LDMOS device 270 and the pick-up doped region of the low-voltage integrated circuit device formed therein. For example, when the first conductivity type is P-type, the second conductivity type is N-type. The high-voltage first conductivity type well region 222 may serve as a high-voltage P-type well region (HVPW) 222. In some embodiments, a bottom surface of the high-voltage first conductivity type well region 222 can be located within the epitaxial layer 220 or can be aligned with an interface 260 (the position of the interface 260 is the same as the position of the top surface 211 of the substrate 200) between the semiconductor substrate 200 and the epitaxial layer 220.

As shown in FIG. 3, the high-voltage semiconductor device 500b includes a high-voltage second conductivity type well region 224 disposed within the epitaxial layer 220 in the high side region 208. The high-voltage second conductivity type well region 224 may provide an isolation doped region of the high-voltage integrated circuit device formed therein. For example, when the first conductivity type is P-type, the second conductivity type is N-type, and the high-voltage second conductivity type well region 224 may serve as a high-voltage N-type well region (HVNW) 224.

In some embodiments, the pick-up doped region in the low side region 202 of the high-voltage semiconductor device 500b may include a first conductivity type drift doped region 230, a first conductivity type well region 226 and a first conductivity type pick-up doped region 234, which are arranged sequentially from bottom to top, disposed on the high-voltage first conductivity type well region 222. For example, when the first conductivity type is P-type, the first conductivity type drift doped region 230 may serve as a P-type drift (P-drift) doped region 230, the first conductivity type well region 226 may serve as a P-type well (PW) region 226, and the first conductivity type pick-up doped region 234 may serve as a P-type pick-up doped region 234.

In some embodiments, the dopant concentration of the first conductivity type pick-up doped region 234 is greater than the dopant concentration of the first conductivity type well region 226, the dopant concentration of the first conductivity type well region 226 is greater than the dopant concentration of the P-type drift doped region 230, and the dopant concentration of the P-type drift doped region 230 is greater than the dopant concentration of the high-voltage first conductivity type well region 222.

In some embodiments, the pick-up doped region in the high side region 208 of the high-voltage semiconductor device 500b may include a second conductivity type drift doped region 238 and a second conductivity type pick-up doped region 236, which are arranged sequentially from bottom to top, disposed on the high-voltage second conductivity type well region 224. For example, when the first conductivity type is P-type, the second conductivity type is N-type, the second conductivity type drift doped region 238 may serve as an N-type well region/N-type drift doped region (NW/N-drift doped region) 238, and the second conductivity type pick-up doped region 236 may serve as an N-type pick-up doped region 236.

In some embodiments, the dopant concentration of the epitaxial layer 220 is lower than the dopant concentration of the high-voltage second conductivity type well region 224. The dopant concentration of the high-voltage second conductivity type well region 224 is lower than the dopant concentration of the second conductivity type drift doped region 238. In addition, the dopant concentration of the second conductivity type drift doped region 238 is lower than the dopant concentration of second conductivity type pick-up doped region 236. In some embodiments, the second conductivity type drift doped region 228 and the second conductivity type drift doped region 238 may be formed in the same step, or in different steps.

As shown in FIG. 3, in the high-voltage semiconductor device 500b, the source doped region of the LDMOS device 270 is disposed crossing the low side region 202 and the level-shift region 204. The source doped region may include a second conductivity type drift doped region 228, a second conductivity type buffer doped region 227 and the second conductivity type pick-up doped region 236, which are arranged sequentially from bottom to top, disposed on the high-voltage first conductivity type well region 222. For example, when the first conductivity type is P-type, the second conductivity type is N-type. The second conductivity type drift doped region 228 may serve as an N-type drift (N-drift) doped region 228. The second conductivity type buffer doped region 227 may serve as an N-type buffer (N-buffer) doped region 227. In addition, the second conductivity type pick-up doped region 236 may serve as an N-type pick-up doped region 236.

As shown in FIG. 3, in the high-voltage semiconductor device 500b, the drain doped region of the LDMOS device 270 is disposed in the level-shift region 204 and is close to the interface between the level-shift region 204 and the isolation region 206. The drain doped region may include the second conductivity type drift doped region 228, the second conductivity type buffer doped region 227 and the second conductivity type pick-up doped region 236, which are arranged sequentially from bottom to top, disposed in the epitaxial layer 220. For example, when the first conductivity type is P-type, the second conductivity type is N-type. The second conductivity type drift doped region 228 may serve as an N-type drift (N-drift) doped region 228. The second conductivity type buffer doped region 227 may serve as an N-type buffer (N-buffer) doped region 227. In addition, the second conductivity type pick-up doped region 236 may serve as an N-type pick-up doped region 236.

As shown in FIG. 3, in the high-voltage semiconductor device 500b, the gate structure 250 of the LDMOS device 270 is disposed on the top surface 221 of the epitaxial layer 220 and is located in the level-shift region 204. The source doped region and the drain doped region of the LDMOS device 270 are respectively located on opposite sides of gate structure 250. The gate structure 250 covers portions of the isolation structures 240, which are located on the high-voltage first conductivity type well region 222 and the epitaxial layer 220. In addition, the gate structure 250 covers the high-voltage first conductivity type well region 222 and the second conductivity type drift doped region 228 (between the low side region 202 and the gate structure 250) above the high-voltage first conductivity type well region

222. The gate structure 250 is separated from the second conductivity type drift doped region 228 of the drain doped region by a distance through another one of the isolation structures 240 (between the gate structure 250 and the high side region 208).

In some embodiments, high-voltage semiconductor device 500b may include a plurality of second conductivity type buried doped layer 212 disposed in a portion of the semiconductor substrate 200 close to the isolation region 206 and the high side region 208 and in a portion of the semiconductor substrate 200 close to a position between the isolation region 206 and the level-shift region 204. In addition, the second conductivity type buried doped layer 212 may diffuse and extend into the epitaxial layer 220. The second conductivity type buried doped layer 212 has a second conductivity type that is different from the first conductivity type. For example, when the first conductivity type is P-type, the second conductivity type is N-type, and the second conductivity type buried doped layer 212 may serve as an N-type buried (N-buried) doped layer.

Next, the position of a super junction doped structure 484 of the high-voltage semiconductor device 500b is described using FIG. 3. The super junction doped structure 484 is located below the isolation structure 240 in the isolation region 206. In addition, the super junction doped structure 484 is located in the epitaxial layer 220. The super junction doped structure 484 is separated from the drain doped region of the LDMOS device 270 and the pick-up doped region of the high side region 208. The super junction doped structure 484 may serve as an isolation doped region of the high-voltage semiconductor device 500b. In some embodiments, the super junction doped structure 484 includes a plurality of first conductive type doped sub-regions 480a, 480b and 480c and a plurality of second conductive type doped sub-regions 482a, 482b and 482c. The first conductive type doped sub-regions 480a, 480b and 480c have the first conductivity type. The first conductive type doped sub-regions 480a, 480b and 480c extend along the first direction 256 (i.e. a direction along the normal line of the top surface (the position is the same as the top surface 221 of the epitaxial layer 220) of the substrate structure 300) and are arranged along a second direction (i.e. a direction from the central region of the super junction doped structure 484 to the peripheral region of the super junction doped structure 484). In addition, the second conductive type doped sub-regions 482a, 482b and 482c, which have the second conductivity type, extend along the first direction 256 and are arranged staggered with the first conductive type doped sub-regions 480a, 480b and 480c along the second direction (i.e. the direction from the central region of the super junction doped structure 484 to the peripheral region of the super junction doped structure 484).

In the cross-sectional view shown in FIG. 3, the first conductive type doped sub-regions 480a, 480b and 480c and the second conductive type doped sub-regions 482a, 482b and 482c are strip (pillar) shapes extending along the first direction 256. It should be noted that the first direction 256 is substantially parallel to a direction along the normal line of the top surface 221 of the substrate structure 300. Also, the second direction is substantially parallel to the direction from the central region of the super junction doped structure 484 to the peripheral region of the super junction doped structure 484.

As shown in FIG. 3, opposite sides of the second conductive type doped sub-regions 482a are respectively adjacent to the first conductive type doped sub-regions 480a and 480b. Opposite sides of the first conductive type doped sub-regions 480b are respectively adjacent to the second conductive type doped sub-regions 482a and 482b. The relationship between the remaining first conductive type doped sub-regions and the remaining second conductive type doped sub-regions close to the corresponding first conductive type doped sub-regions may be similar to the relationship between the first conductive type doped sub-regions 480a and 480b and the second conductive type doped sub-regions 482a and 482b. However, in other embodiments, the positions of the first conductive type doped sub-regions 480a, 480b and 480c and the positions of the second conductive type doped sub-regions 482a, 482b and 482c can be exchanged.

In some embodiments, in the super junction doped structure 484, at least one of the depths of the first conductive type doped sub-regions 480a, 480b and 480c along the first direction 256, the widths of the first conductive type doped sub-regions 480a, 480b and 480c along the second direction (from the central region of the super junction doped structure 484 to the peripheral region of the super junction doped structure 484) and the dopant concentrations of the first conductive type doped sub-regions 480a, 480b and 480c decrease linearly along the second direction. Similarly, at least one of the depths of the second conductive type doped sub-regions 482a, 482b and 482c along the first direction 256, the widths of the second conductive type doped sub-regions 482a, 482b and 482c along the second direction (from the central region of the super junction doped structure 484 to the peripheral region of the super junction doped structure 484) and the dopant concentrations of the second conductive type doped sub-regions 482a, 482b and 482c decrease linearly along the second direction. In addition, a bottom surface of the super junction doped structure 484 can be aligned with the bottom surface of the epitaxial layer 220 (the position of the bottom surface of the epitaxial layer 220 is the same as the position of the top surface 211 of the substrate 200). In some other embodiments, the lowest portion of the super junction doped structure 484 can be located above the bottom surface of the epitaxial layer (i.e. the lowest portion of the super junction doped structure 484 is not in contact with the top surface 211 of the semiconductor substrate 200).

Figure 4A:
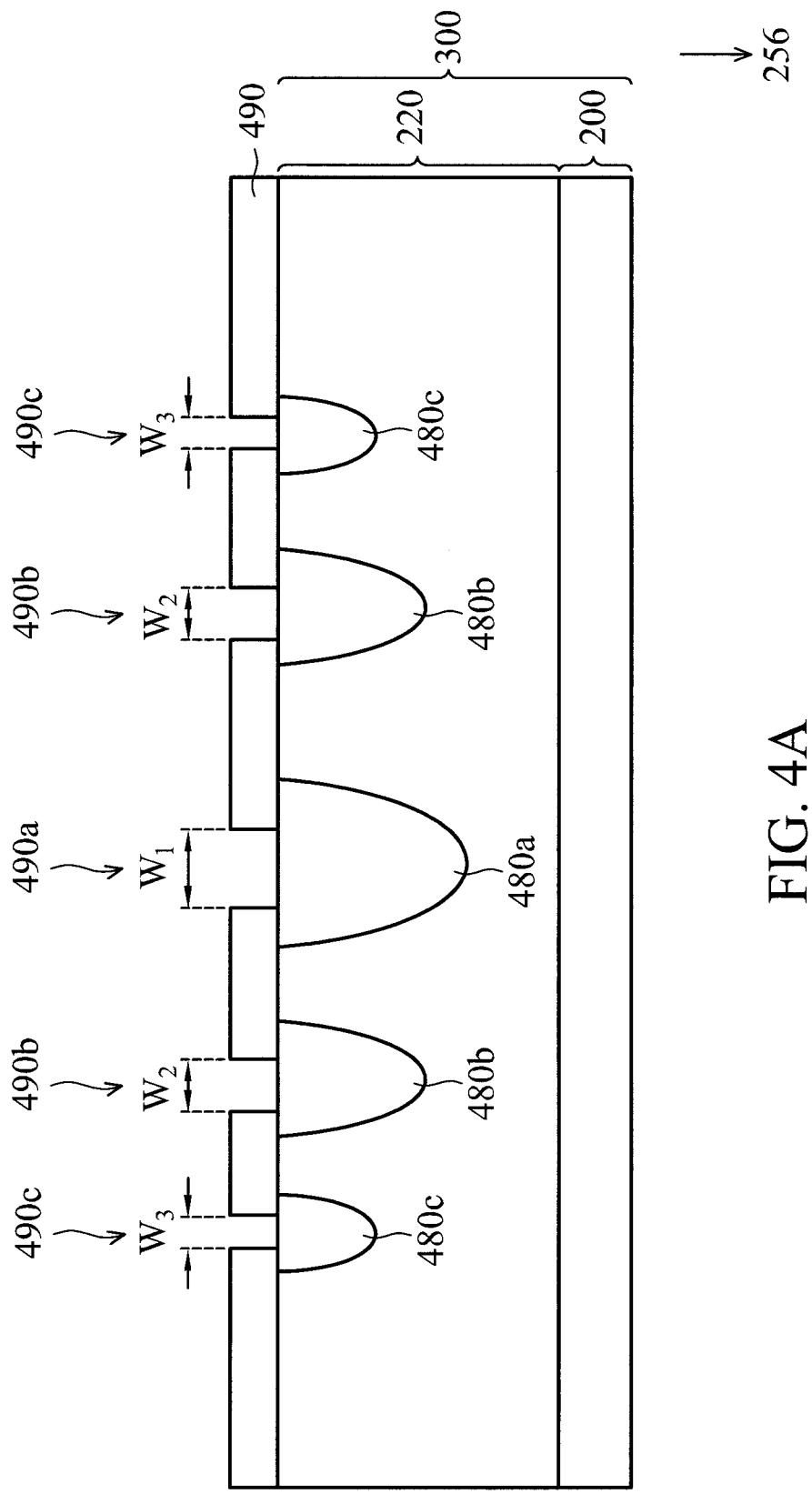
FIGS. 4A and 4B are schematic cross-sectional views showing intermediate stages of a method for fabricating a super junction doped structure in an isolation region in accordance with some embodiments of the disclosure.
Figure 4B:
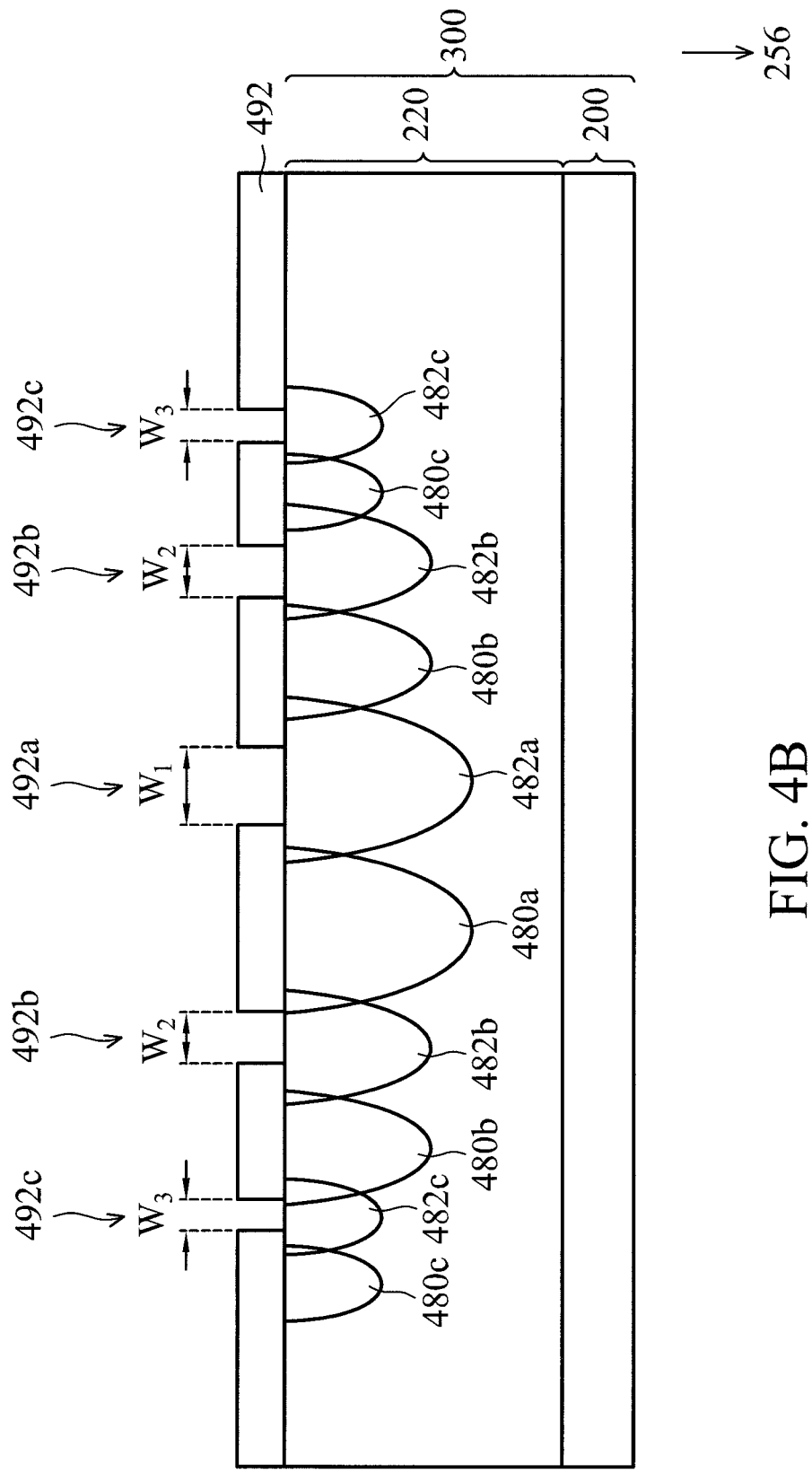

Next, the method for fabricating the super junction doped structure 484 shown in FIG. 3 in accordance with some embodiments of the disclosure is described using FIGS. 4A and 4B. FIGS. 4A and 4B are enlarged views of the isolation region 206 of the semiconductor device shown in FIG. 1. Also, FIGS. 4A and 4B illustrate intermediate stages of a method for fabricating the super junction doped structure 484 in the isolation region 206. The method is performed before forming the isolation structures 240 shown in FIG. 3. Therefore, the isolation structures 240 are not shown in FIGS. 4A and 4B.

As shown in FIG. 4A, a photolithography process may be performed to form a mask pattern 490 on the top surface 221 of the epitaxial layer 220 in the isolation region 206 (shown in FIG. 3). The mask pattern 490 may have a plurality of openings 490a, 490b and 490c. The openings 490a of the mask pattern 490 are disposed to be close to the central region of the super junction doped structure 484. In addition, the openings 490b and 490c of the mask pattern 490 are arranged sequentially from the central region of the isolation region 206 to the peripheral region of the isolation region 206 (e.g. close to the interface between the isolation region 206 and the level-shift region 204 and close to another interface between the isolation region 206 and the high side region 208 shown in FIG. 1). In this embodiment, the width W1 of the opening 490a, the width W2 of the opening 490b and the width W3 of the opening 490c are designed to be decreased linearly and sequentially from the central region of the isolation region 206 to the peripheral region of the isolation region 206. In any two neighboring openings of the openings 490a-490c of the mask pattern 490, the width of the one close to the central region of the isolation region 206 is greater than that of the other one that is farther away from central region of the isolation region 206.

Next, an implantation process is performed using the mask pattern 490 as a mask to implant the dopant having the first conductivity type in the epitaxial layer 220. Therefore, a plurality of first conductive type doped sub-regions 480a, 480b and 480c are formed in the epitaxial layer 220. Because the widths W1-W3 of the openings 490a-490c of the mask pattern 490 decrease linearly from the central region of the isolation region 206 to the peripheral region of the isolation region 206, the depths and/or the dopant concentrations of the first conductive type doped sub-regions 480a, 480b and 480c decrease linearly from the central region of the isolation region 206 to the peripheral region of the isolation region 206 (e.g. close to the interface between the isolation region 206 and the level-shift region 204 and close to another interface between the isolation region 206 and the high side region 208). In some other embodiments, two neighboring isolation doped sub-regions overlap each other. Next, the mask pattern 490 is removed.

In some embodiments, the first conductive type doped sub-regions 480a, 480b and 480c and the high-voltage first conductivity type well region 222 may be formed simultaneously.

Next, please refer to FIG. 4B: another photolithography process may be performed to form a mask pattern 492 on the top surface 221 of the epitaxial layer 220 in the drift region 108 (shown in FIG. 3). The mask pattern 492 may have a plurality of openings 492a, 492b and 492c. In some embodiments, as shown in FIG. 4B, the relationship between the widths W1-W3 of the openings 492a-492c may be similar to that between the widths W1-W3 of the openings 490a-490c and is not repeated herein.

In other embodiments, the widths of the openings of the mask pattern 492 may be designed to have different values and only to ensure that the widths of the openings of the mask pattern 492 decrease linearly from the central region of the isolation region 206 to the peripheral region of the isolation region 206.

Next, please refer to FIG. 4B, an implantation process is performed using the mask pattern 492 as a mask to implant a dopant having the second conductivity type. Therefore, a plurality of second conductive type doped sub-regions 482a, 482b and 482c are formed in the epitaxial layer 220 exposed to the openings 492a-492c. The second conductive type doped sub-regions 482a-482c are respectively adjacent to the first conductive type doped sub-regions 480a-480c. The relationship of depths and/or the dopant concentrations between the second conductive type doped sub-regions 482a-482c is similar to the relationship of depths and/or the dopant concentrations between the first conductive type doped sub-regions 480a-480c and is not repeated herein. Next, the mask pattern 492 is removed.

In some embodiments, the second conductive type doped sub-regions 492a-492c and the high-voltage second conductivity type well region 224 may be formed simultaneously.

Next, an annealing process is performed to cause the uniform diffusion of the dopants in the first conductive type doped sub-regions 480a-480c and the second conductive type doped sub-regions 482a-482c shown in FIG. 4B. Therefore, the diffused first conductive type doped sub-regions 480a-480c and the diffused second conductive type doped sub-regions 482a-482c form the super junction doped structure 484 having a plurality of PN junctions shown in FIG. 3.

In some embodiments, the super junction doped structure 484 is arranged in the isolation region of the high-voltage semiconductor device 500b, such as a high-voltage integrated circuit (HVIC) device. The super junction doped structure 484 may serve as an isolation doped region between the high side region 208 and the low side region 202. At least one of the widths, the depths and the dopant concentrations of the first conductive type doped sub-regions and the second conductive type doped sub-regions of the super junction doped structure 484 decrease linearly from the central region of the super junction doped structure 484 (or the isolation region 206) to the peripheral region of the super junction doped structure 484. The design of the super junction doped structure (the isolation doped region) may help fully deplete the super junction doped structure, so that the super junction doped structure is in the charge balance condition. In addition, the design of the super junction doped structure may help to uniformly distribute the surface field of the HVIC device, so that the high breakdown voltage (BVD) of the high-voltage integrated circuit is improved. On the other hand, the super junction doped structure can increase the effective width between the high side region and the low side region while satisfying the requirements of the improved BVD. Therefore, the dopant concentration of the super junction doped structure is high enough to suppress the lateral punch-through leakage current.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor device, comprising:
   a substrate structure;
   a gate structure on the substrate structure;
   a drain doped region located in the substrate structure and close to a first side of the gate structure; and
   a source doped region located in the substrate structure and close to a second side of the gate structure, wherein the second side is opposite to the first side, and wherein the source doped region, the gate structure and the drain doped region are located close to a top surface of the substrate structure;
   a super junction doped structure located in the substrate structure and close to the drain doped region, wherein the super junction doped structure comprises:
   a plurality of first conductive type doped sub-regions having a first conductivity type, wherein the plurality of first conductive type doped sub-regions extends along a first direction and is arranged along a second direction; and
   a plurality of second conductive type doped sub-regions having a second conductivity type that is different from the first conductivity type, extending along the first direction and staggered with the plurality of first conductive type doped sub-regions along the second direction, wherein widths of the plurality of first conductive type doped sub-regions along the second direction decrease linearly along the second direction, and wherein widths of the plurality of second conductive type doped sub-regions along the second direction decrease linearly along the second direction, wherein dopant concentrations of the plurality of first conductive type doped sub-regions decrease linearly along the second direction, or wherein dopant concentrations of the plurality of second conductive type doped sub-regions decrease linearly along the second direction.

2. The high-voltage semiconductor device as claimed in claim 1, wherein depths of the plurality of first conductive type doped sub-regions along the first direction decrease linearly along the second direction, or wherein depths of the plurality of second conductive type doped sub-regions along the first direction decrease linearly along the second direction.

3. The high-voltage semiconductor device as claimed in claim 1, wherein the super junction doped structure is located between the gate structure and the drain doped region and is separated from the drain doped region.

4. The high-voltage semiconductor device as claimed in claim 1, wherein the first direction is substantially parallel to a direction along a normal line of the top surface of the substrate structure, and the second direction is substantially parallel to a direction from the gate structure to the drain doped region.

5. The high-voltage semiconductor device as claimed in claim 1, wherein the substrate structure comprises:
a semiconductor substrate having the first conductivity type; and
an epitaxial layer disposed on the semiconductor substrate, wherein the epitaxial layer has the second conductivity type that is different from the first conductivity type.

6. The high-voltage semiconductor device as claimed in claim 5, wherein the substrate structure comprises:
a high side region;
a low side region separated from the high side region; and
a level-shift region and an isolation region disposed between the high side region and the low side region, wherein the level-shift region and the high side region are separated from each other by the isolation region;
wherein the super junction doped structure is located in the isolation region.

7. The high-voltage semiconductor device as claimed in claim 6, wherein the super junction doped structure is located in the epitaxial layer, and a bottom surface of the super junction doped structure is aligned with a bottom surface of the epitaxial layer.

8. The high-voltage semiconductor device as claimed in claim 6, wherein the first direction is substantially parallel to a direction along a normal line of the top surface of the substrate structure, and the second direction is substantially parallel to a direction from a central region of the super junction doped structure to a peripheral region of the super junction doped structure.

9. The high-voltage semiconductor device as claimed in claim 8, wherein the peripheral region of the super junction doped structure is close to at least one of the level-shift region and the high side region.

10. A high-voltage semiconductor device, comprising:
a substrate structure;
a gate structure on the substrate structure;
a drain doped region located in the substrate structure and close to a first side of the gate structure;
a source doped region located in the substrate structure and close to a second side of the gate structure, wherein the second side is opposite to the first side, and wherein the source doped region, the gate structure and the drain doped region are located close to a top surface of the substrate structure; and a super junction doped structure located in the substrate structure and close to the drain doped region,
wherein the super junction doped structure comprises:
a plurality of first conductive type doped sub-regions having a first conductivity type, wherein the plurality of first conductive type doped sub-regions extends along a first direction and is arranged along a second direction; and
a plurality of second conductive type doped sub-regions having a second conductivity type that is different from the first conductivity type, extending along the first direction and staggered with the plurality of first conductive type doped sub-regions along the second direction,
wherein dopant concentrations of the plurality of first conductive type doped sub-regions decrease linearly along the second direction,
wherein at least one of depths of the plurality of first conductive type doped sub-regions along the first direction and widths of the plurality of first conductive type doped sub-regions along the second direction decrease linearly along the second direction.

11. The high-voltage semiconductor device as claimed in claim 10, wherein at least one of depths of the plurality of second conductive type doped sub-regions along the first direction, widths of the plurality of second conductive type doped sub-regions along second direction and dopant concentrations of the plurality of second conductive type doped sub-regions decrease linearly along the second direction.

12. The high-voltage semiconductor device as claimed in claim 10, wherein the super junction doped structure is located between the gate structure and the drain doped region and is separated from the drain doped region.

13. The high-voltage semiconductor device as claimed in claim 10, wherein the first direction is substantially parallel to a direction along the normal line of a top surface of the substrate structure, and the second direction is substantially parallel to a direction from the gate structure to the drain doped region.

14. The high-voltage semiconductor device as claimed in claim 10, wherein the substrate structure comprises:
a semiconductor substrate having the first conductivity type; and
an epitaxial layer disposed on the semiconductor substrate, wherein the epitaxial layer has the second conductivity type,
wherein the substrate structure is divided into regions comprising:
a high side region;
a low side region separated from the high side region; and
a level-shift region and an isolation region disposed between the high side region and the low side region, wherein the level-shift region and the high side region are separated from each other by the isolation region;
wherein the super junction doped structure is located in the isolation region.

15. The high-voltage semiconductor device as claimed in claim 14, wherein the first direction is substantially parallel to a direction along the normal line of a top surface of the substrate structure, and the second direction is substantially parallel to a direction from a central region of the super junction doped structure to a peripheral region of the super junction doped structure.

16. A high-voltage semiconductor device, comprising:
   a substrate structure;
   a gate structure on the substrate structure;
   a drain doped region located in the substrate structure and close to a first side of the gate structure; and
   a source doped region located in the substrate structure and close to a second side of the gate structure, wherein the second side is opposite to the first side, and wherein the source doped region, the gate structure and the drain doped region are located close to a top surface of the substrate structure;
   wherein the substrate structure comprises:
   a semiconductor substrate having a first conductivity type; and
   an epitaxial layer disposed on the semiconductor substrate, wherein the epitaxial layer has a second conductivity type,
   wherein the substrate structure is divided into regions comprising:
   a high side region;
   a low side region separated from the high side region; and
   a level-shift region and an isolation region disposed between the high side region and the low side region, wherein the level-shift region and the high side region are separated from each other by the isolation region;
   wherein a super junction doped structure is located in the isolation region;
   wherein the super junction doped structure is located in the substrate structure and close to the drain doped region, wherein the super junction doped structure comprises:
   a first conductive type doped sub-region and a second conductive type doped sub-region adjacent to each other, wherein the first conductive type doped sub-region has the first conductivity type and the second conductive type doped sub-region has the second conductivity type that is different from the first conductivity type,
   wherein the first conductive type doped sub-region and the second conductive type doped sub-region extend along a first direction and are arranged along a second direction, wherein the first direction is substantially parallel to a direction along a normal line of a top surface of the substrate structure, and the second direction is substantially parallel to a direction from the gate structure to the drain doped region; and
   wherein at least one of a depth of the first conductive type doped sub-region along the first direction, a width of the first conductive type doped sub-region along the second direction and a dopant concentration of the first conductive type doped sub-region is different from the second conductive type doped sub-region along the second direction; and
   another second conductive type doped sub-region adjacent to the first conductive type doped sub-region, and the second conductive type doped sub-region and the other second conductive type doped sub-region are located on opposite sides of the first conductive type doped sub-region, wherein at least one of the depth of the first conductive type doped sub-region along the first direction, the width of first conductive type doped sub-region along second direction and the dopant concentration of the first conductive type doped sub-region is the same as the other second conductive type doped sub-region.

* * * * *